US012062594B2

(12) United States Patent
Son

(10) Patent No.: US 12,062,594 B2
(45) Date of Patent: Aug. 13, 2024

(54) INTEGRATED CIRCUIT DEVICE INCLUDING A THROUGH-VIA STRUCTURE

(71) Applicant: SAMSUNG ELECTRONICS CO., LTD., Suwon-si (KR)

(72) Inventor: Bongjin Son, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 336 days.

(21) Appl. No.: 17/697,049

(22) Filed: Mar. 17, 2022

(65) Prior Publication Data

US 2022/0406688 A1 Dec. 22, 2022

(30) Foreign Application Priority Data

Jun. 16, 2021 (KR) ........................ 10-2021-0078164

(51) Int. Cl.
*H01L 21/00* (2006.01)
*H01L 23/48* (2006.01)
*H01L 25/065* (2023.01)

(52) U.S. Cl.
CPC ........ *H01L 23/481* (2013.01); *H01L 25/0657* (2013.01); *H01L 2225/06544* (2013.01)

(58) Field of Classification Search
CPC ............... H01L 23/481; H01L 25/0657; H01L 2225/06544
See application file for complete search history.

(56) References Cited

U.S. PATENT DOCUMENTS 8,890,282 B2 11/2014 Lee et al.
9,666,551 B1 * 5/2017 Seo ....................... H01L 23/481
9,735,251 B2 8/2017 Deng
10,431,553 B2 10/2019 Ozawa
10,658,341 B2 5/2020 Seo et al.
11,769,742 B2 * 9/2023 Jeong ...................... H01L 24/05 257/734
2007/0272949 A1 * 11/2007 Shinomiya ............ G06F 30/394 257/E23.151
2008/0283959 A1 11/2008 Chen et al.
(Continued)

FOREIGN PATENT DOCUMENTS

EP 2717300 B1 * 3/2020 ......... H01L 21/7684

*Primary Examiner* — Laura M Menz
(74) *Attorney, Agent, or Firm* — F. CHAU & ASSOCIATES, LLC

(57) ABSTRACT

An integrated circuit device includes: a substrate having an active surface, an inactive surface, a first region and a second region; a device structure on the active surface, and including individual devices disposed in the first region and a target through-region disposed in the second region; a multilayer wiring structure including wiring layers, wherein at least one wiring layer among the wiring layers has a landing pad overlapping the target through-region; and a through-via structure connected to the landing pad by penetrating through the second region and the target through-region, wherein the target through-region includes first insulating material patterns and dummy device patterns, wherein the first insulating material patterns each have a first area, wherein the dummy device patterns are on the active surface and each have a second area smaller than the first area, and wherein the first insulating material patterns are alternatively arranged with the dummy device patterns.

20 Claims, 10 Drawing Sheets

(56) References Cited

U.S. PATENT DOCUMENTS

2010/0015805 A1 1/2010 Mayer et al.
2013/0021060 A1 1/2013 Or-Bach
2014/0054774 A1 2/2014 Uchida et al.
2017/0229412 A1* 8/2017 Seo ........................ H01L 23/481
2017/0263596 A1* 9/2017 Son ......................... H01L 24/11
2020/0135699 A1 4/2020 Hwang et al.
2022/0352178 A1* 11/2022 Kim .................. H01L 21/76229
2022/0406688 A1* 12/2022 Son ....................... H01L 27/088
2023/0082884 A1* 3/2023 Ko ........................ H01L 23/481 257/113
2023/0138813 A1* 5/2023 Seo ..................... H01L 25/0657 257/774
2023/0282528 A1* 9/2023 Seo ......................... H01L 24/05
2024/0030103 A1* 1/2024 Lee ......................... H01L 24/17
2024/0032310 A1* 1/2024 Mun ................. H01L 23/49816

* cited by examiner

INTEGRATED CIRCUIT DEVICE INCLUDING A THROUGH-VIA STRUCTURE

CROSS-REFERENCE TO RELATED APPLICATION

This application claims priority under 35 U.S.C. 119(a) of Korean Patent Application No. 10-2021-0078164 filed on Jun. 16, 2021 in the Korean Intellectual Property Office, the disclosure of which is incorporated by reference herein in its entirety.

TECHNICAL FIELD

The present inventive concept relates to an integrated circuit device, and more particularly, to an integrated circuit device including a through-via structure.

DISCUSSION OF THE RELATED ART

Generally, integrated circuit devices may have a through-via structure such as a through-silicon-via (TSV) forming an electrical connection in a vertical direction to form, for example, a 3-dimensional (3D) package in which a plurality of chips are mounted, or to form, for example, a backside redistribution layer. Typically, the through-via structure may be formed to penetrate through a semiconductor substrate from the backside of the semiconductor substrate (e.g., an inactive surface of the semiconductor substrate) to be electrically connected to a wiring layer. Therefore, a technology for forming a through-via structure having stable and reliable electrical connections is desirable.

SUMMARY

According an example embodiment of the present inventive concept, an integrated circuit device includes: a substrate having an active surface and an inactive surface opposite to the active surface, wherein the substrate has a first region and a second region; a device structure disposed on the active surface of the substrate, wherein the device structure has a plurality of individual devices disposed in the first region of the substrate and a target through-region disposed in the second region of the substrate; a multilayer wiring structure including a plurality of wiring layers disposed at different levels in the multilayer wiring structure, wherein at least one wiring layer among the plurality of wiring layers has a landing pad overlapping the target through-region; and a through-via structure connected to the landing pad by penetrating through the second region of the substrate to pass through the target through-region, wherein the target through-region includes a plurality of first insulating material patterns and a plurality of dummy device patterns, wherein the plurality of first insulating material patterns are formed with a predetermined depth from the active surface and each have a first area, wherein the plurality of dummy device patterns are disposed on the active surface and each have a second area smaller than the first area, and wherein the plurality of first insulating material patterns are alternatively arranged with the plurality of dummy device patterns, in a direction parallel to the active surface of the substrate.

According to an example embodiment of the present inventive concept, an integrated circuit device includes: a substrate having an active surface and an inactive surface opposite to the active surface, wherein the substrate has a first region and a second region at least partially surrounding the first region; a device structure disposed on the active surface of the substrate, wherein the device structure has a plurality of individual devices disposed in the first region of the substrate and a plurality of target through-regions arranged in the second region of the substrate; a multilayer wiring structure including a plurality of wiring layers disposed at different levels in the multilayer wiring structure, wherein at least one wiring layer among the plurality of wiring layers has a plurality of landing pads, overlapping the plurality of target through-regions, respectively; and a plurality of through-via structures connected to the plurality of landing pads by penetrating through the second region of the substrate to pass through the plurality of target through-regions, respectively, wherein each of the plurality of target through-regions includes a lattice structure including a plurality of first insulating material patterns and a plurality of dummy device patterns, wherein the plurality of first insulating material patterns are formed with a predetermined depth from the active surface and each have a square shape with a first area, wherein the plurality of dummy device patterns are disposed on the active surface and each have a rectangular shape with a second area smaller than the first area, and wherein the plurality of first insulating material patterns are alternately arranged with the plurality of dummy device patterns in a row direction and a column direction.

According to an example embodiment of the present inventive concept, an integrated circuit device includes: a substrate having an active surface and an inactive surface opposite to the active surface, wherein the substrate has a first region and a second region at least partially surrounding the first region; a device structure disposed on the active surface of the substrate, wherein the device structure includes a first device isolation pattern and a plurality of individual devices, wherein a first device isolation pattern is formed with a first depth from the active surface of the first region and defines an active region, and wherein the plurality of individual devices are disposed on the active region; a plurality of target through-regions disposed along the active surface of the second region in the device structure, wherein the plurality of target through-regions include a plurality of second device isolation patterns and a plurality of dummy device patterns, wherein the plurality of second device isolation patterns are formed with a second depth from the active surface and each have a first area, and wherein the plurality of dummy device patterns are disposed on the active surface and each have a second area smaller than the first area, and wherein the plurality of second device isolation patterns are alternately arranged with the plurality of dummy device patterns, in a direction parallel to the active surface of the substrate; a multilayer wiring structure disposed on the device structure and including a plurality of wiring layers at different levels, wherein at least one wiring layer of the plurality of wiring layers has a plurality of landing pads respectively overlapping each of the plurality of target through-regions; a plurality of through-via structures respectively connected to the plurality of landing pads by penetrating through the second region of the substrate to pass through each of the plurality of target through-regions; and a redistribution structure disposed on the inactive surface of the substrate and including a redistribution layer connected to the plurality of through-via structures.

BRIEF DESCRIPTION OF DRAWINGS

The above and other features of the present inventive concept will become more apparent by describing in detail example embodiments thereof, with reference to the accompanying drawings, in which.

DETAILED DESCRIPTION OF THE EMBODIMENTS

Hereinafter, example embodiments of the present inventive concept will be described with reference to the accompanying drawings.

Figure 1:
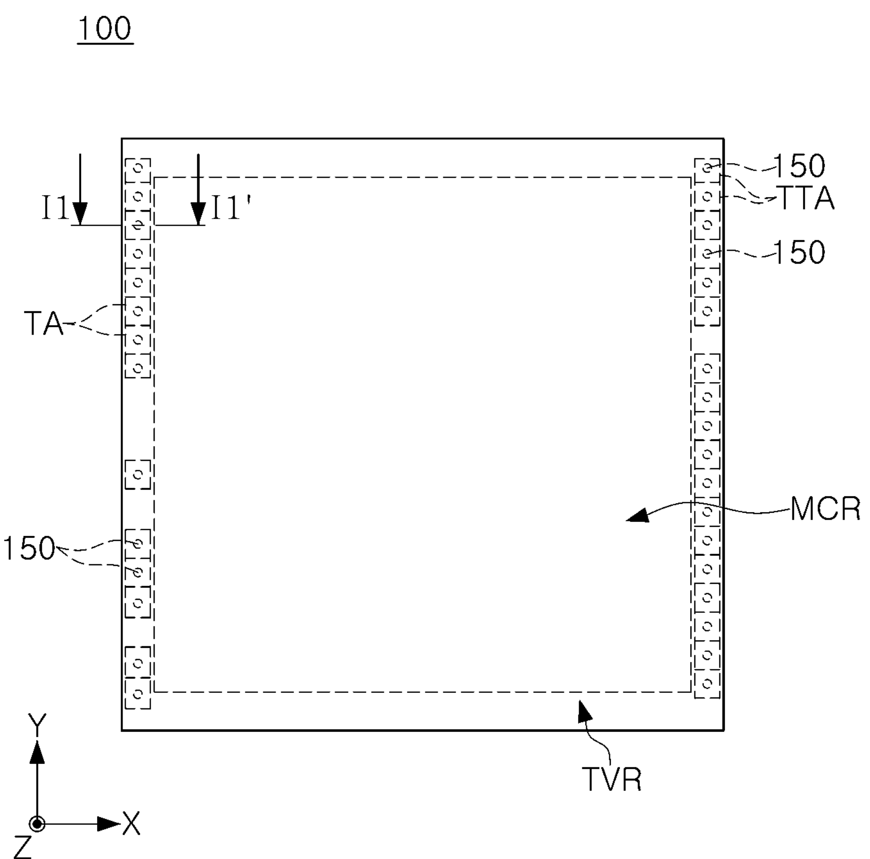
FIG. 1 is a plan view illustrating an integrated circuit device according to an example embodiment of the present inventive concept.
Figure 2:
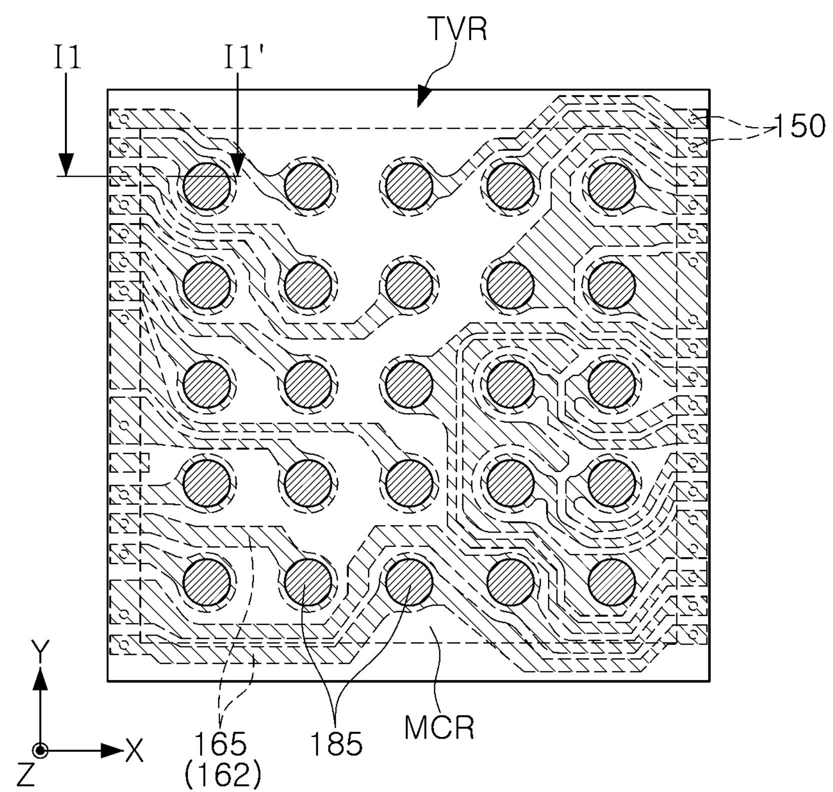
FIG. 2 is a rear view illustrating the integrated circuit device illustrated in FIG. 1.
Figure 3:
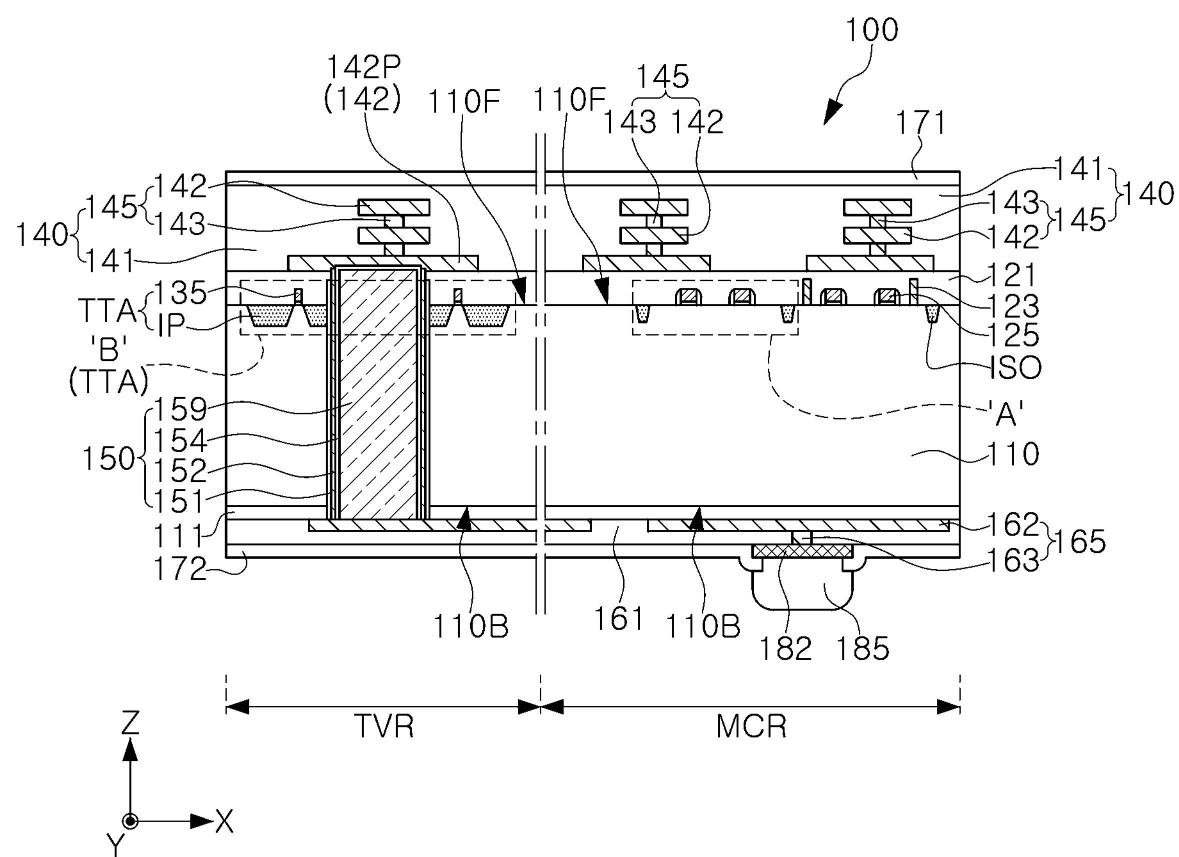
FIG. 3 is a cross-sectional view of the integrated circuit device of FIGS. 1 and 2 taken along line I-I'.

FIGS. 1 and 2 are plan and rear views of an integrated circuit device according to an example embodiment of the present inventive concept, respectively, and FIG. 3 is a cross-sectional view taken along line I-I' of the integrated circuit device of FIGS. 1 and 2.

Referring to FIGS. 1 to 3, an integrated circuit device 100 according to an example embodiment of the present inventive concept may include a substrate 110 including a plurality of main device regions MCR and a through-via region TVR.

Elements may be disposed in the main device region MCR according to the function of the integrated circuit device. For example, when the integrated circuit device 100 is a memory device, a plurality of memory cells may be disposed in the main device region MCR. For example, when the integrated circuit device 100 is a CMOS image sensor (CIS) device, pixel regions and transistors may be disposed in the main device region MCR. A plurality of through-via structures 150 penetrating the substrate 110 may be disposed in the through-via region TVR. The plurality of through-via structures 150 may be electrically connected to externals terminals 185. A signal may be received from external terminals 185 through the through-via structures 150, or a signal may be transmitted to the external terminals 185 through the through-via structures 150. In this specification, regions of the substrate 110 corresponding to the main device region MCR and the through-via region TVR may be divided and referred to as a "first region" and a "second region", respectively.

The arrangement of the main device region MCR and the through-via region TVR illustrated in FIG. 1 is an illustrative example, and the arrangement of the main device region MCR and the through-via region TVR may vary. For example, unlike the present embodiment, a plurality of main device regions MCR may be disposed on the substrate 110, and the through-via region TVR may be disposed therebetween. In an example embodiment of the present inventive concept (see FIGS. 8 and 9), a peripheral circuit region including peripheral circuits such as a control circuit and an electrostatic discharge (ESD) circuit may be further included.

The substrate 110 may have an active surface 110F (or, e.g., a first surface, a front surface, or an upper surface) and an inactive surface 110B (or, e.g., a second surface, a rear surface, or a lower surface) opposing each other. For example, the substrate 110 may include a semiconductor substrate including, for example, silicon (Si), germanium (Ge), silicon carbide (SiC), gallium arsenide (GaAs), indium arsenide (InAs), or indium phosphide (InP). In an example embodiment of the present inventive concept, the substrate 110 may have a silicon-on-insulator (SOI) structure. For example, the substrate 110 may include a buried oxide layer (BOX).

As illustrated in FIG. 3, in an example embodiment of the present inventive concept, the substrate 110 may include a device isolation pattern ISO formed to a predetermined depth from the active surface 110F, and an active region (refer to "ACT" of FIG. 4) defined by the device isolation pattern ISO. For example, the active region ACT may be disposed between the device isolation patterns ISO. For example, the active region may include a well doped with an impurity or a structure doped with an impurity. In addition, the device isolation pattern ISO may have various device isolation structures such as shallow trench isolation (STI).

The integrated circuit device 100 may include a device structure disposed on the active surface 110F of the substrate 110. The device structure may include a plurality of individual devices 125, a via contact 123, and an interlayer insulating layer 121 surrounding the plurality of individual devices 125 and the via contact 123. The interlayer insulating layer 121 is formed on the active surface 110F of the substrate 110 and is disposed to surround the plurality of individual devices 125 and the via contact 123 electrically connected to the plurality of individual devices 125. For example, the interlayer insulating layer 121 may be disposed on the plurality of individual devices 125 and the via contact 123. For example, the plurality of individual devices 125 may include a memory device such as a DRAM, a PRAM, a flash memory, a ReRAM or the like, a metal-oxide-semiconductor field effect transistor (MOSFET), system large scale integration (LSI), an image sensor such as a CMOS imaging sensor (CIS), a micro-electro-mechanical system (MEMS), an active device, a passive device, or the like. The device structure may be used as an active region and used as a term including the active region, and may also be referred to as a front-end-of-line (FEOL) structure.

The integrated circuit device 100 may include a multilayer wiring structure 140 disposed on the device structure. For example, the multilayer wiring structure 140 may be disposed on the interlayer insulating layer 121 of the device structure. The multilayer wiring structure 140 may include an intermetallic insulating layer 141 and a plurality of wiring layers 145. The intermetallic insulating layer 141 may be disposed on the interlayer insulating layer 121, and the plurality of wiring layers 145 may be disposed on different levels in the intermetallic insulating layer 141. The intermetallic insulating layer 141 may be disposed to surround the plurality of wiring layers 145. In an example embodiment of the present inventive concept, the intermetallic insulating layer 141 may have a stack structure formed of a plurality of insulating layers, and each of the plurality of insulating layers may be disposed to surround each wiring layer 145. Each of the plurality of wiring layers 145 may include a wiring pattern 142 and a wiring via 143. The wiring pattern 142 may be disposed on the insulating layer, and the wiring via 143 may pass through each insulating layer and may connect adjacent wiring patterns 142 to each other. For example, the wiring layer 145 may be formed of Ni, Cu, Al, Au, W, or combinations thereof, but the configuration is not limited thereto. The multilayer wiring structure 140 may be referred to as a back-end-of-line (BEOL) structure. A first passivation layer 171 may be disposed on the multilayer wiring structure 140. For example, the first passivation layer 171 may include polyimide or silicon nitride.

The through-via structure 150 may penetrate through a second region (or the through-via region TVR) of the substrate 110 to be connected to a landing pad 142P. The landing pad 142P may be provided as a portion positioned in the first region among the plurality of wiring patterns 142. In the present embodiment, the landing pad 142P is provided as a portion of a lowermost wiring layer, but the configuration is not limited thereto. In an example embodiment of the present inventive concept, the landing pad 142P may be provided as a portion of a wiring layer of another level or provided as a separate pad. The landing pad 142P may also reinforce a portion of the wiring layer to be provided as a pad, using an additional metal layer.

Referring to FIGS. 2 and 3, the integrated circuit device 100 according to the present embodiment may include a redistribution structure 160 disposed on the inactive surface 110B of the substrate 110. The redistribution structure may include a redistribution layer 165 and an insulating layer 161. The redistribution layer 165 may be connected to the through-via structure 150, and the insulating layer 161 may at least partially surround the redistribution layer 165. The redistribution layer 165 may be electrically insulated from the substrate 110 by a substrate insulating layer 111 disposed on the inactive surface 110B of the substrate 110. For example, the substrate insulating layer 111 may be disposed between the inactive surface 110B of the substrate 110 and the insulating layer 161. The redistribution layer 165 may include a redistribution pattern 162, and a redistribution via 163 connected to the redistribution pattern 162.

A connection pad 182 may be disposed on the redistribution layer 165, and a second passivation layer 172 may be disposed on the insulating layer 161 and may include an opening exposing at least a portion of the connection portion 182. For example, the connection pad 182 may include Al, Ni, Cu, or combinations thereof, and the second passivation layer 172 may include, for example, polyimide or silicon nitride.

In the present embodiment, as illustrated in FIG. 2, a plurality of external terminals 185 may be arranged in, for example, a 5×5 grid on the inactive surface 110B of the substrate 110 by the redistribution pattern 162. The plurality of external terminals 185 may be respectively disposed in the areas of the connection pads 182 exposed through the openings. In addition, each of the plurality of external terminals 185 is electrically connected to a corresponding connection pad 182. The external terminal 185 is electrically connected to the plurality of individual devices 125 positioned in the main device region MCR through the through-via structure 150 and the wiring layer 145, and the integrated circuit device 100 may receive a signal from the external terminal 185, or may transmit a signal to the external terminal 185 through the through-via structure 150. For example, the external terminal 185 may include Sn, Ag, Pb, Au, Cu, B, or alloys thereof.

Referring to FIG. 3, the through-via structure 150 employed in the present embodiment may be configured to penetrate through a target through-region TTA in the device structure. As used herein, the term "target through-region TTA" refers to a pre-designed dummy pattern area for the through-via structure 150. In addition, a dummy device pattern 135 is disposed in the pre-designed dummy pattern area. For example, the dummy device pattern 135 may be formed in the through-via region TVR and may be formed together with the individual devices 125 of the main device region MCR.

The quality of the etching process for a hole 150H for the through-via structure 150 is dependent on a material layer located below the landing pad 142P, and since a portion of a material constituting the dummy device pattern 135 located in the region in which the through-via structure 150 is to be formed still remains after etching, it may be difficult to secure contact reliability between the through-via structure 150 and the landing pad 142P formed in a subsequent process. For example, after etching to form a hole, some material (e.g., poly-Si) of the dummy device pattern 135 may remain in the etched region, causing deterioration of contact reliability. However, since the dummy device pattern 135 corresponding to the individual device 125 is inevitably formed in a region other than the main device region MCR, for example, in the through-via region TVR, it may be difficult to exclude the dummy device pattern 135 from a region that is to be etched.

In the present embodiment, in the target through-region TTA, the dummy device pattern 135 may be provided with a relatively low density, but is configured to be uniformly distributed with the insulating material pattern IP formed together with the device isolation pattern ISO. For example, the dummy device pattern 135 may be formed between adjacent insulating material patterns IP. For example, the insulating material pattern IP may be a device isolation pattern. Therefore, contact failure due to a residual material (e.g., polysilicon) after etching may be effectively prevented.

Figure 4:
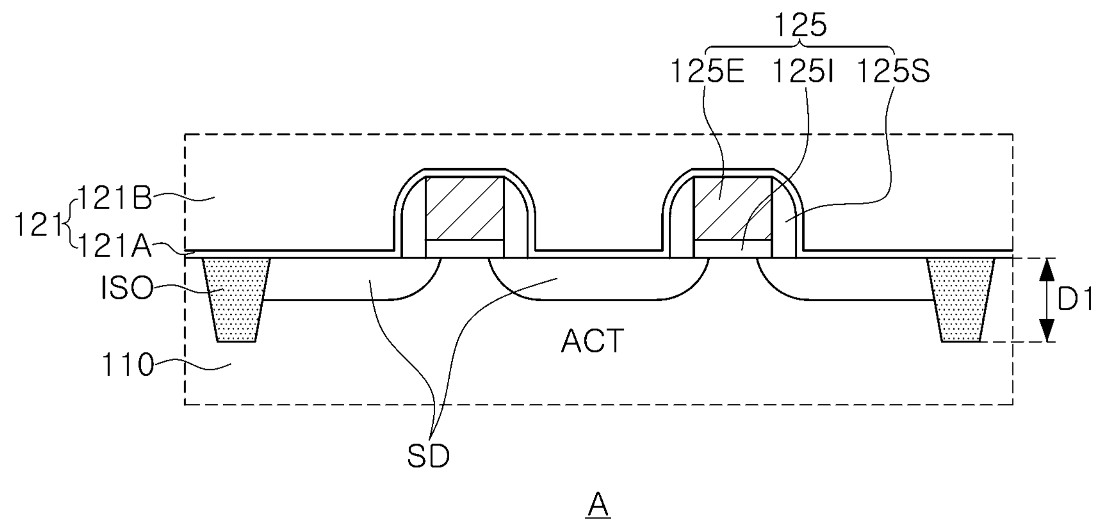
FIGS. 4 and 5 are partially enlarged views illustrating portions A and B of FIG. 3, respectively.
Figure 5:
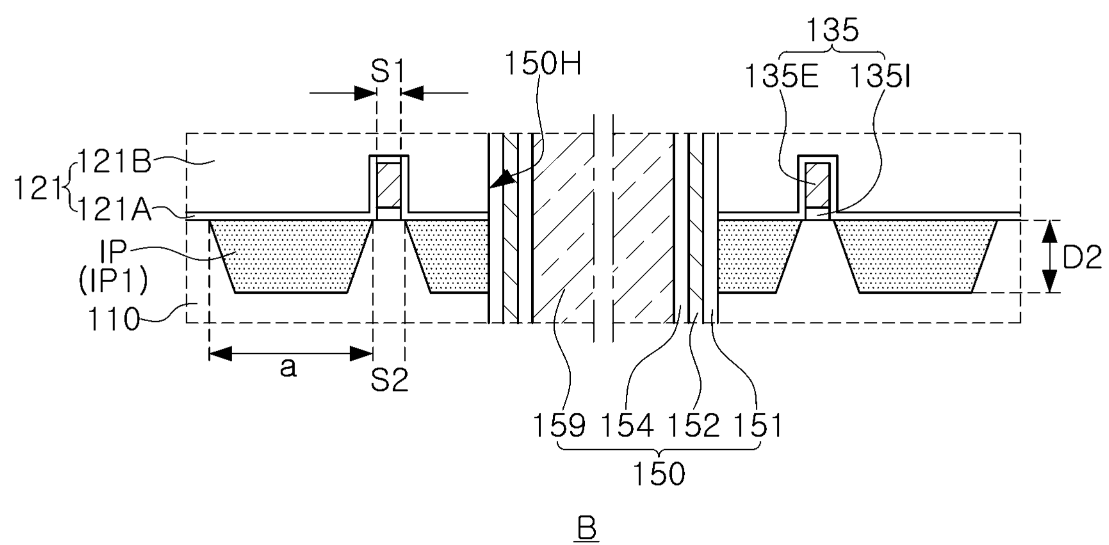

Hereinafter, the target through region TTA employed in the present embodiment will be described in detail with reference to FIGS. 4 to 6 together with FIG. 3. FIGS. 4 and 5 are partially enlarged views illustrating portions A and B of FIG. 3, respectively, and FIG. 6 is a plan view illustrating one target through-region TTA employed in the present embodiment.

Figure 6:
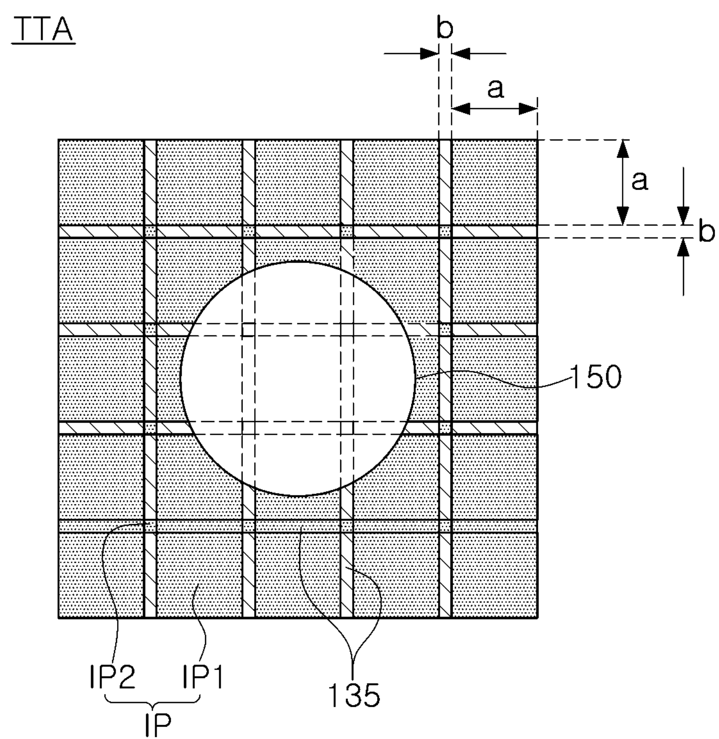
FIG. 6 is a plan view of one target through-region illustrated in the integrated circuit device illustrated in FIG. 3.

Referring to FIGS. 5 and 6 (in detail, referring to FIG. 6) along with FIG. 3, the target through-region TTA has a structure, in which a plurality of first insulating material patterns IP1 and a plurality of dummy device patterns 135 are alternately arranged. The plurality of first insulating material patterns IP1 may be formed to a second depth D2 from the active surface 110F and may each have a first area. The plurality of dummy device patterns 135 may be disposed on the active surface 110F and may each have a second area smaller than the first area. In an example embodiment of the present inventive concept, the second area of the dummy device pattern 135 may range from about 10% to about 40% of the first area of the first insulating material pattern IP1.

Referring to FIG. 5, the plurality of dummy device patterns 135 may each include a dummy electrode pattern 135E and a dummy insulating pattern 135I respectively corresponding to a gate electrode 125E and a gate insulating layer 125I of the individual device illustrated in FIG. 4. The dummy electrode pattern 135E and the dummy insulating pattern 135I are formed using the same process as that of the gate electrode 125E and the gate insulating layer 125I, and may be formed of the same material as that of the gate electrode 125E and the gate insulating layer 125I, respectively. For example, the dummy electrode pattern 135E and the gate electrode 125E may include polysilicon.

Similarly, the insulating material pattern IP may be formed together with the device isolation pattern ISO through the same process. The insulating material pattern IP may include the same material as the device isolation pattern ISO. For example, the insulating material pattern IP and the device isolation pattern ISO may include an oxide layer, a nitride layer, or a combination thereof.

In an example embodiment of the present inventive concept, since the insulating material pattern IP has a planar area much larger than that of the device isolation pattern ISO, the second depth D2 of the insulating material pattern IP may be greater than the first depth D1 of the device isolation pattern ISO. In addition, the interlayer insulating layer 121 may include a first insulating layer 121A, such as silicon nitride, and a second insulating layer 121B, such as silicon oxide.

As such, the same configuration is not necessarily formed over the main device region MCR and the through-via region TVR, and the two regions MCR and TVR may have partially different configurations from each other depending on an applied mask pattern. For example, referring to FIG. 4, the individual device 125 of the main device region MCR may further include a configuration such as a gate spacer 125S and a source/drain region SD, unlike the dummy device patterns 135. In an example embodiment of the present inventive concept, a width S1 of the dummy device pattern 135 may be less than an interval S2 between adjacent first insulating material patterns IP1.

As illustrated in FIG. 6, the target through-region TTA employed in the present embodiment has a lattice structure including the plurality of first insulating material patterns IP1 and the plurality of dummy device patterns 135 alternately arranged in a first direction (e.g., an X direction) a second direction (e.g., a Y direction) substantially perpendicular to each other. In this manner, the target through-regions TTA may be arranged in a substantially uniform distribution using the lattice structure.

In the present embodiment, each of the plurality of first insulating material patterns IP1 may have, for example, a square shape, and each of the plurality of dummy device patterns 135 may have, for example, a bar shape or a rectangular shape. The dummy device pattern 135 tray have a first side (a) corresponding to the length of one side (a) of the first insulating material pattern IP1, and may have a second side (b) that is shorter than the first side (a).

The target through-region TTA may include a plurality of second insulating material patterns IP2 respectively disposed between four adjacent corners of the corners of the plurality of first insulating material patterns IP1. The area of the dummy device pattern 135 may be reduced while maintaining a substantially uniform arrangement of the lattice structure by using the second insulating material pattern IP2. In an example embodiment of the present inventive concept, the second area of the dummy device patterns 135 may be reduced to about 40 $\mu m^2$ or less. For example, the second area of the dummy device patterns 135 may be in a range of about 20 $\mu m^2$ to about 40 $\mu m^2$. The second insulating material patterns IP2 may be formed of the same material as the first insulating material pattern IP1, together.

As described above, the target through-region TTA may provide the dummy device pattern 135 with a relatively low density. In one target through-region TTA, the sum of the second areas of the plurality of dummy electrode patterns 135 may be in a range of about 10% to about 40% of the total area of the target through-region TTA. In one target through-region TTA, the sum of the second areas of the plurality of dummy electrode patterns 135 may range from about 15% to about 30% (e.g., from about 15% to about 25%) of the total area of the target through-region TTA.

The target through-region TTA may be formed to have an area larger than that of the through-via structure 150 as illustrated in FIG. 6, in consideration of the alignment margin. For example, a planar area of the target through-region TTA, which is penetrated by the through-via structure 150, may be less than or equal to about 60% of a total area of the target through-region TTA defined by the outer periphery of the target through-region TTA. In the final integrated circuit device 100, as illustrated in FIG. 6, even when a portion of the target through-region TTA is removed by the through via structure 150, respective area conditions may be checked with the structure (e.g., the lattice structure) in which the insulating material pattern IP and the dummy device pattern 135 are alternately arranged.

As described above, the through-via structure 150 may penetrate through the substrate 110 and the interlayer insulating layer 121 to be connected to the landing pad 142P. The through-via structure 150 may include a via-insulating layer 151, a first conductive barrier layer 152, a second conductive barrier layer 154, and a conductive plug 159.

At least a portion of the through-via structure 150 may be disposed inside the through-hole 150H penetrating through the substrate 110 and the interlayer insulating layer 121. The through-hole 150H may extend from the inactive surface 110B of the substrate 110 to the active surface 110F of the substrate 110. The via-insulating layer 151, the first conductive barrier layer 152, the second conductive barrier layer 154, and the conductive plug 159 may be sequentially disposed on the innerwall of the through-hole 150H.

The via-insulating layer 151 may be disposed on an inner sidewall of the through-hole 150H. For example, the via-insulating layer 151 may at least partially surround an inner sidewall of the through-hole 150H. The via-insulating layer 151 may act as an insulating spacer to prevent a conductive material (e.g., the conductive plug 159 and the first and second conductive barrier layers 152 and 154) included in the through-via structure 150 from being in direct contact with the substrate 110. For example, the via-insulating layer 151 may be formed of an oxide film, a nitride film, a carbide film, a polymer, or combinations thereof. In an example embodiment of the present inventive concept, a chemical vapor deposition (CVD) process may be used to form the via-insulating layer 151. The via-insulating layer 151 may have a thickness of about 500 to about 3000 Å. For example, the via-insulating layer 151 may include silicon oxide.

The first conductive barrier layer 152 may be disposed on a sidewall of the via-insulating layer 151. The first conductive barrier layer 152 may contact the landing pad 142P, and may extend from the bottom surface of the through-hole 150H. For example, the first conductive barrier layer 152 may include at least one of W, WN, WC, Ti, TiN, Ta, TaN, Ru, Co, Mn, WN, Ni, and/or NiB. The first conductive harrier layer 152 may have a thickness of about 500 to about 2000 Å.

The second conductive barrier layer 154 may be disposed on a sidewall of the first conductive barrier layer 152. For example, the second conductive barrier layer 154 may be disposed on a bottom surface of the first conductive barrier layer 152. For example, the second conductive barrier layer 154 may be disposed on the redistribution layer 165. For example, the second conductive barrier layer 154 may include at least one of W, WN, WC, Ti, TiN, Ta, TaN, Ru, Co, Mn, WN, Ni, and/or NiB. The second conductive barrier layer 154 may have a thickness of about 500 to about 2000 Å. In an example embodiment of the present inventive concept, the second conductive barrier layer 154 may include the same material as the first conductive barrier layer 154, or any one of the materials may be omitted.

The conductive plug 159 may extend from the inactive surface 110B of the substrate 110 and beyond the active surface 110F of the substrate 110, and the bottom surface of the conductive plug 159 may be disposed on a level lower than the bottom surface of the interlayer insulating layer 121. In an example embodiment of the present inventive concept, the conductive plug 159 may be formed of, but is not limited to, Cu, CuSn, CuMg, CuNi, CuZn, CuPd, CuAu, CuRe, CuW, W, and/or a W alloy. The conductive plug 159 may include one or more of, for example, Al, Au, Be, Bi, Co, Cu, Hf, In, Mn, Mo, Ni, Pb, Pd, Pt, Rh, Re, Ru, Ta, Te, Ti, W, Zn, and/or Zr, and may include one or two or more stack structures.

Figure 7:
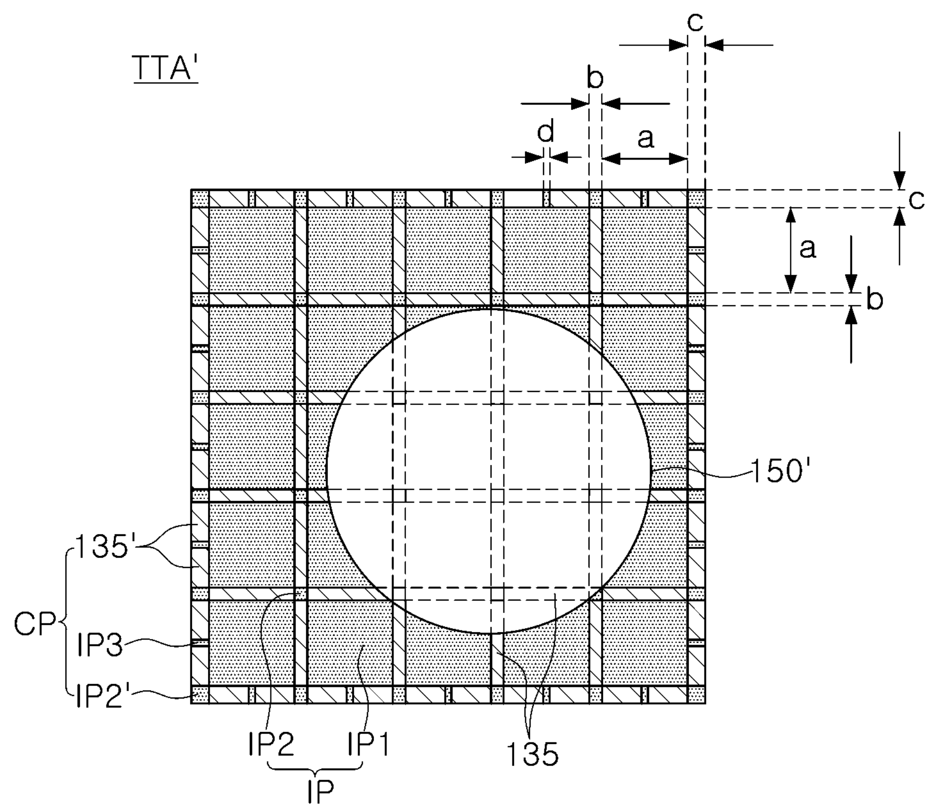
FIG. 7 is a plan view illustrating a target through-region illustrated in an integrated circuit device according to an example embodiment of the present inventive concept.

FIG. 7 is a plan view illustrating a target through-region illustrated in an integrated circuit device according to an example embodiment of the present inventive concept.

Referring to FIG. 7, a target through-region TTA' according to an example embodiment of the present inventive concept may further include an outer peripheral pattern CP surrounding the arrangement (e.g., the target through-region TTA of FIG. 6) illustrated in FIG. 6. The outer peripheral pattern CP may include an outer peripheral dummy device pattern 135', a first outer peripheral insulating material pattern IP2' adjacent to a corner of the first insulating material pattern IP1, a second outer peripheral insulating material pattern IP3' positioned on one side of the first insulating material pattern IP1.

The outer peripheral pattern CP may be a connection pattern for connecting adjacent target through-regions (refer to the adjacent TTAs of FIG. 1). When the distance between adjacent target through-regions increases, a width c of the outer-peripheral dummy device pattern 135' may increase to be greater than a width b of the second insulating material pattern IP3'. Therefore, to maintain the upper limit condition (e.g., about 40 $\mu m^2$ or less) of the area of the outer-peripheral dummy device pattern 135', by adding a second outer-peripheral insulating material pattern IP3' having a predetermined width d, the outer-peripheral dummy device pattern 135' may be divided to be plural (e.g., two), thereby reducing the area. In addition, since the outer peripheral pattern CP is not a region in which the through-via structure 150 is to be formed, unlike the target through-region, a ratio (e.g., about 15 to about 30%) of a total area of the outer-peripheral dummy device pattern 135' to the total area of the outer peripheral pattern CP does not need to be significantly reduced. In an example embodiment, the outer peripheral pattern CP may be extended and arranged in a region other than the target through-region (TTA of FIG. 6) in the through-via region TVR.

In addition, although the area of the through-via structure 150' is relatively large, the area is small compared to that of the target through-region TTA', and as in the present embodiment, even in the case in which the through-via structure 150' is offset (e.g., toward the lower right) due to an alignment error, a structure (e.g., a lattice structure) in which the insulating material pattern IP and the dummy device pattern 135' are alternately arranged in the remaining region of the target-through region TTA, and respective area conditions, may be observed sufficiently.

Figure 8:
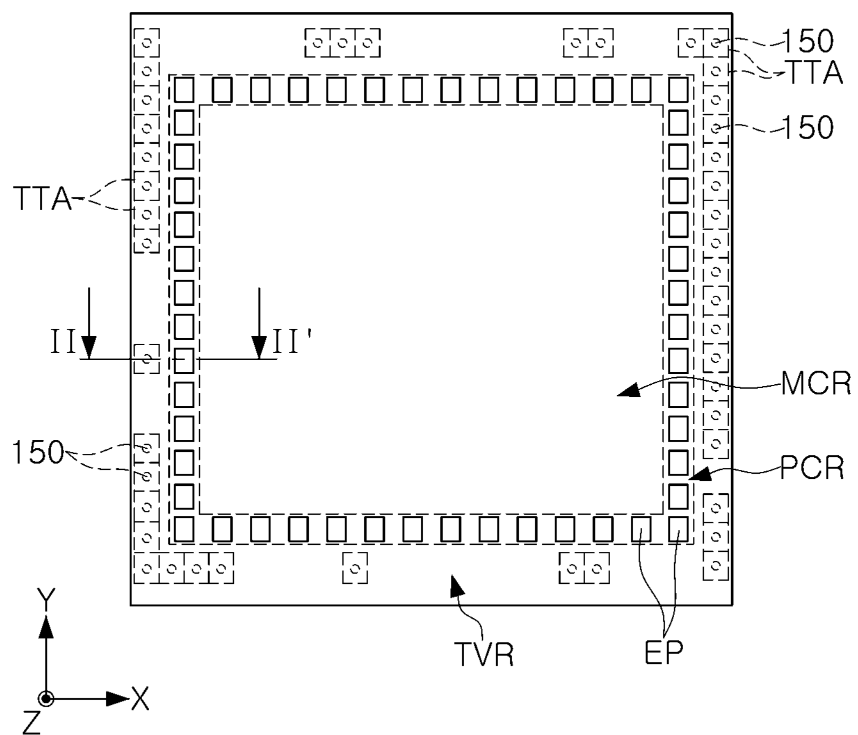
FIG. 8 is a plan view illustrating an integrated circuit device according to an example embodiment of the present inventive concept.
Figure 9:
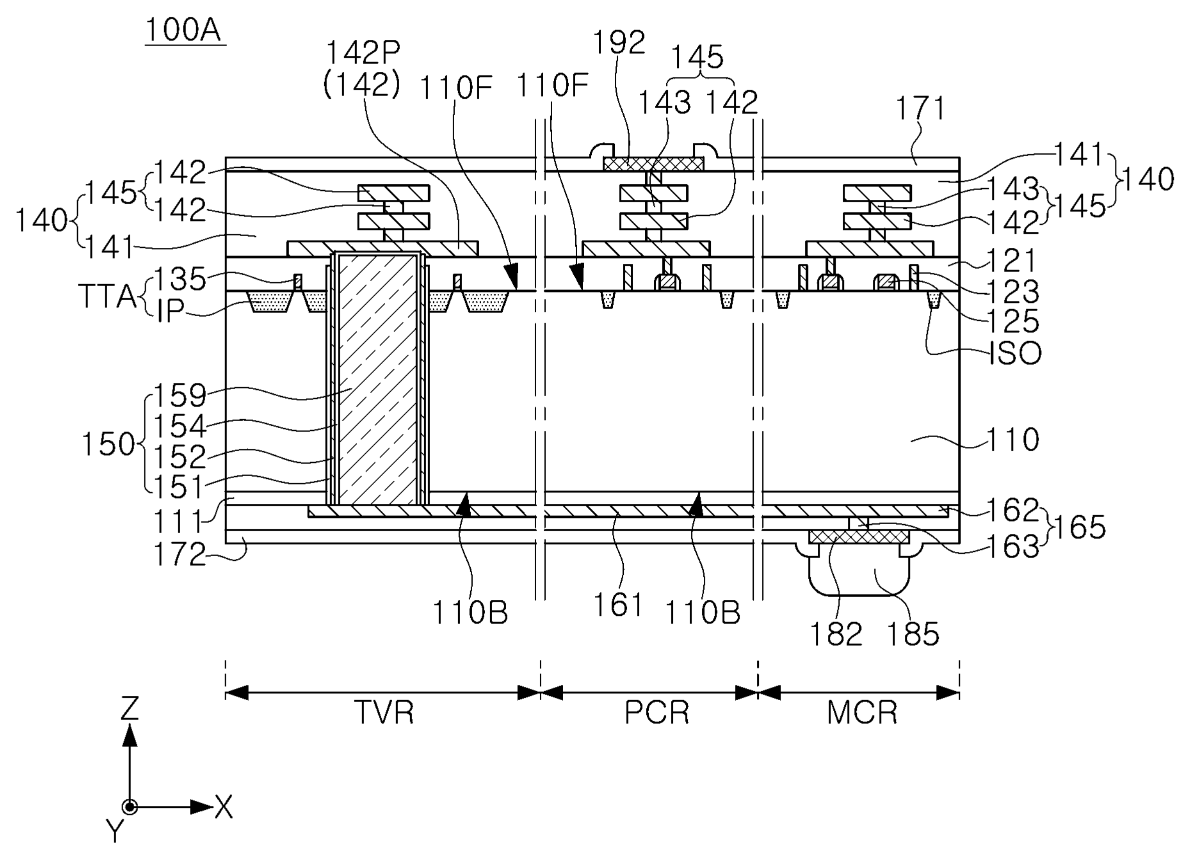
FIG. 9 is a cross-sectional view of the integrated circuit device of FIG. 8 taken along line II-II'.

FIG. 8 is a plan view illustrating an integrated circuit device according to an example embodiment of the present inventive concept, and FIG. 9 is a cross-sectional view of the integrated circuit device of FIG. 8 taken along line II-II'.

Referring to FIGS. 8 and 9, an integrated circuit device 100A according to an example embodiment of the present inventive concept may be understood as having a structure similar to that of the integrated circuit device 100 illustrated in FIGS. 1 to 6, except that it further includes a peripheral circuit region PCR. Components of the present embodiment may be understood with reference to descriptions of the same or similar components of the integrated circuit device 100 illustrated in FIGS. 1 to 6 unless otherwise specified. Further, to the extent that various elements are not described in detail with respect to FIGS. 8 and 9, it may be assumed that these elements are at least similar to corresponding elements described in detail elsewhere within the instant application.

The integrated circuit device 100A according to the present embodiment may further include the peripheral circuit region PCR between the main device region MCR and the through-via region TVR. The peripheral circuit region PCR may include individual devices for peripheral circuits such as control circuits and ESD circuits. For example, individual devices in the peripheral circuit region PCR may be formed similarly to individual devices in the main device region MCR, and may thus include an ESD circuit. In addition, a connection pad 192 may be formed on a multilayer wiring structure 140 located in the peripheral circuit region PCR, and the connection pad 192 may be provided as, for example, a test pad or an external terminal for a package-on-package (POP) structure.

In the present embodiment, the integrated circuit device 100A may have a structure including the target through-region TTA in which an insulating material pattern IP having a first area and a dummy device pattern 135 having a second area smaller than the first area are alternately arranged in the through-via region TVR. In this manner, in the case of the target through-region TTA, the insulating material patterns IP may be uniformly arranged, to have the dummy device pattern 135 at a relatively low density, such that a contact defect caused by the residual material (e.g., polysilicon) after etching may be effectively prevented.

Figure 10:
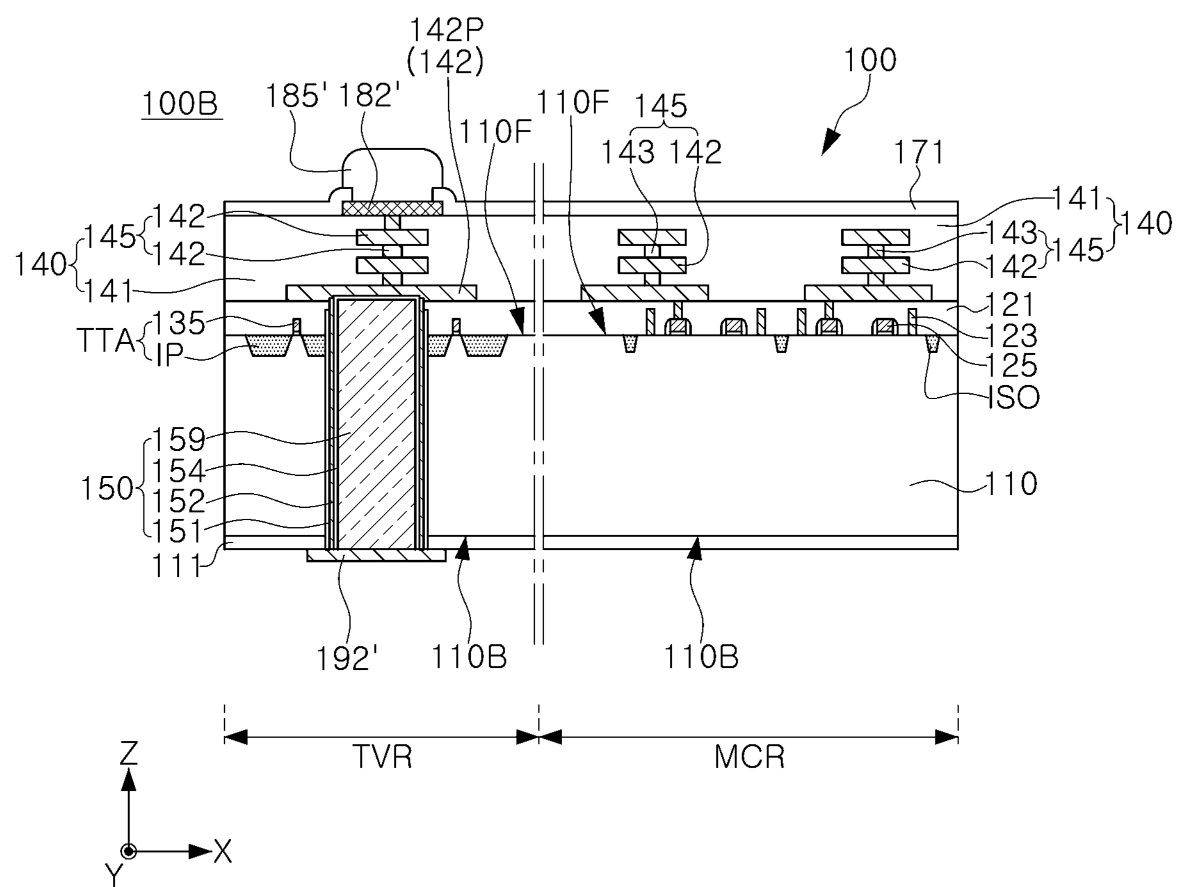
FIG. 10 is a cross-sectional view illustrating an integrated circuit device according to an example embodiment of the present inventive concept.

FIG. 10 is a cross-sectional view illustrating an integrated circuit device according to an example embodiment of the present inventive concept.

Referring to FIG. 10, in an integrated circuit device 100B according to an example embodiment of the present inventive concept, except that first and second connection pads 182' and 192' are provided on upper and lower surfaces of the integrated circuit device 100B, respectively, using a through-via structure 150, the integrated circuit device 100B may be understood to have a structure similar to that of the integrated circuit device 100 illustrated in FIGS. 1 to 6. Components of the present embodiment may be understood with reference to descriptions of the same or similar components of the integrated circuit device 100 illustrated in FIGS. 1 to 6 unless otherwise specified. Further, to the extent that various elements are not described in detail with respect to FIG. 10, it may be assumed that these elements are at least similar to corresponding elements described in detail elsewhere within the instant application.

In the integrated circuit device 100B according to the present embodiment, the first connection pad 182' may be disposed on the multilayer wiring structure 140, and a passivation layer 171 including an opening exposing at least a portion of an upper surface of the first connection pad 182' may be disposed on an intermetallic insulating layer 141. An external terminal 185' may be disposed on the exposed portion of the first connection pad 182'. The second connection pad 192' connected to the through-via structure 150 may be formed on an inactive surface 110B of a substrate 110. A vertical connection structure for a PoP structure may be provided by the first and second connection pads 182' and 192' and the through-via structure 150.

For example, the external terminal 185' may include Sn, Ag, Pb, Au, Cu, B, or alloys thereof. For example, at least one of the first connection pad 182' or the second connection pad 192' may include Al, Ni, Cu, or combinations thereof, and the passivation layer 171 may include polyimide or silicon nitride.

Figure 11:
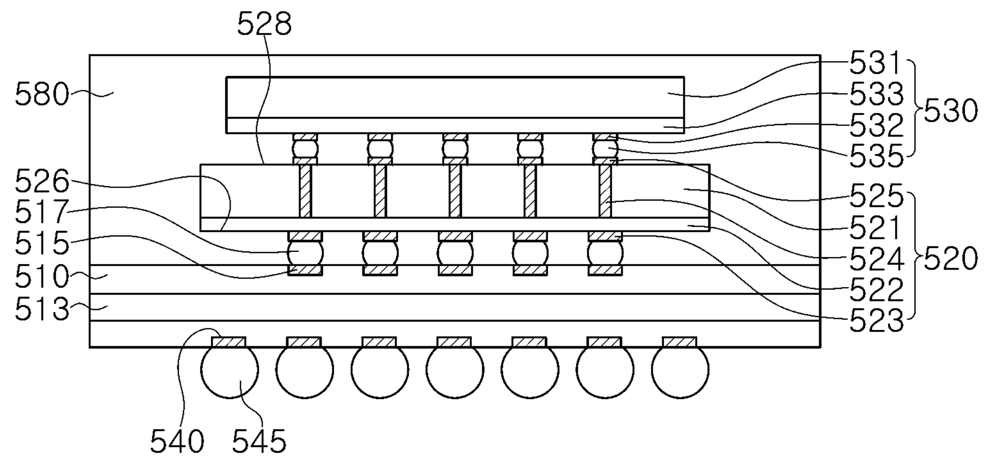
FIGS. 11 and 12 are each a cross-sectional view of a semiconductor package including an integrated circuit device according to an example embodiment of the present inventive concept.

FIG. 11 is a cross-sectional view of a semiconductor package including an integrated circuit device according to an example embodiment of the present inventive concept.

Referring to FIG. 11, a semiconductor package 500 may include a package substrate 510, a first integrated circuit device 520, a second integrated circuit device 530, and a molding layer 580.

The package substrate 510 may be provided by forming, for example, a printed circuit having a predetermined shape on a substrate formed of glass, ceramic, plastic or the like, but the configuration is not limited thereto. An external terminal 545, for electrically connecting the semiconductor package 500 to an external device, may be formed on the lower surface of the package substrate 510.

The external terminal 545 may be formed in a grid array such as a pin grid array, a ball grid array, or a land grid array. The lower package pad 540 may be electrically connected to the external terminal 545 connected to an external device, and the package substrate 510 may provide an electrical signal to a first integrated circuit device 520 and a second integrated circuit device 530 through a package substrate upper pad 515 formed on the upper surface of the package substrate 510. At least one of the lower package pads 540 may be, for example, a ground pad, and may be electrically connected to a ground line in the package substrate 510.

The first integrated circuit device 520 and the second integrated circuit device 530 may be sequentially stacked on the package substrate 510 to form a POP structure. For example, the first integrated circuit device 520 may be disposed on the package substrate 510, and the second integrated circuit device 530 may be disposed on the first integrated circuit device 520. The first integrated circuit device 520 and the second integrated circuit device 530 may be in the form of, for example, flip chips.

The second integrated circuit device 530 and the first integrated circuit device 520 may be, for example, a memory chip, a logic chip, or the like. For example, when the second integrated circuit device 530 and/or the first integrated circuit device 520 is a logic chip, the second integrated circuit device 530 and/or the first integrated circuit device 520 may be variously designed in consideration of operations or the like to be performed. In this case, the logic chip may be a microprocessor, for example, a central processing unit (CPU), a controller, or an application specific integrated circuit (ASIC). For example, when the second integrated circuit device 530 and/or the first integrated circuit device 520 is a memory chip, the memory chip may be, for example, a volatile memory such as DRAM or SRAM, or a nonvolatile memory such as a flash memory. For example, the memory chip may be a flash memory chip.

The first integrated circuit device 520 is disposed on the package substrate 510. The first integrated circuit device 520 includes the integrated circuit devices 100A and 100B according to the above-described embodiment, and may include a target through-region TTA in which an insulating material pattern IP having a first area and a dummy device pattern 135 having a second area smaller than the first area are alternately arranged in a region forming a through-via structure 524.

A second connection pad 525 disposed on a second surface 528 of the first integrated circuit device 520 may be electrically connected to a first connection pad 532 of the second integrated circuit device 530, and the second connection pad 525 may be electrically connected to a through-via structure 524 such as a TSV. Accordingly, the first integrated circuit device 520 and the second integrated circuit device 530 may be electrically connected to each other through the through-via structure 524.

The first integrated circuit device 520 may be electrically connected to the package substrate 510 through a first connection pad 523 formed on a first surface 526. For example, a first bump 517 is disposed between the first connection pad 523 and a package substrate upper pad 515 to electrically connect the first connection pad 523 and the package substrate upper pad 515 to each other.

The first integrated circuit device 520 may be electrically connected to the second integrated circuit device 530. The second connection pad 525 of the first integrated circuit device 520 is connected to the first connection pad 532 of the second integrated circuit device 530 through the second bump 535, and thus, the first integrated circuit device 520 may be electrically connected to the second integrated circuit device 530. The first integrated circuit device 520 may include a first substrate 522 and a first device layer 521 formed on the first substrate 522, and the second integrated circuit device 520 may include a second substrate 533 and a second device layer 531 formed on the second substrate 533. The first connection pad 532 of the second integrated circuit device 530 may be formed on a surface of the second integrated circuit device 530. For example, the second device layer 531 may be electrically connected to the first connection pad 532. In addition, the second integrated circuit device 530 may be electrically connected to the package substrate 510 through the through-via structure 524 formed in the first integrated circuit device 520.

In the present embodiment, the first integrated circuit device 520 and the second integrated circuit device 530 are illustrated as a single chip, but the present inventive concept is not limited thereto, and at least one thereof may be composed of a plurality of chips.

A molding layer 580 may be formed on the package substrate 510 to cover the first and second integrated circuit devices 520 and 530. The molding layer 580 may protect the first and second integrated circuit devices 520 and 530 from outside or external conditions. The molding layer 580 may include, for example, an epoxy molding compound (EMC) or one or more types of silicon hybrid materials.

Figure 12:
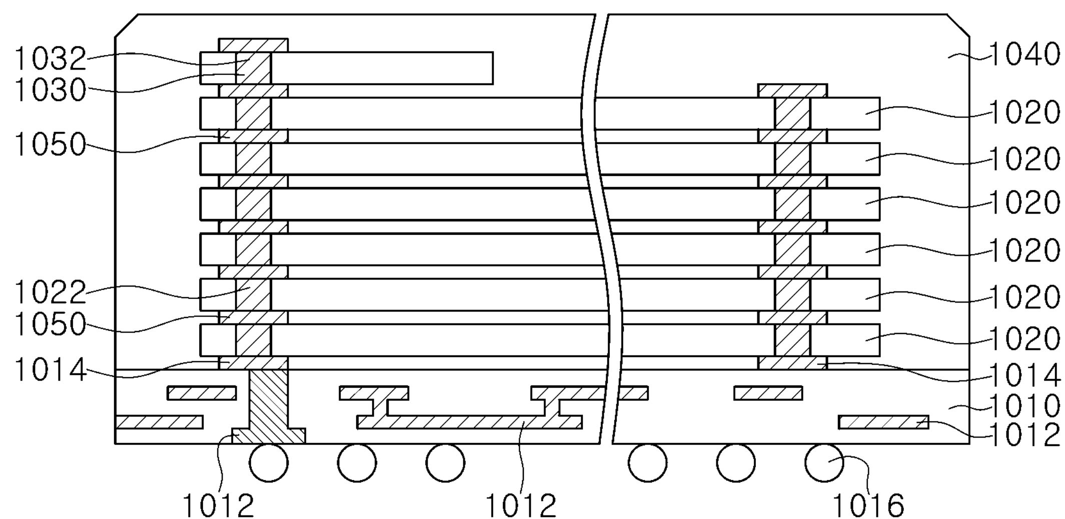

FIG. 12 is a cross-sectional view of a semiconductor package including an integrated circuit device according to an example embodiment of the present inventive concept.

Referring to FIG. 12, a semiconductor package 1000 according to an example embodiment of the present inventive concept includes a plurality of semiconductor chips 1020 sequentially stacked on a package substrate 1010. A control chip 1030 is connected to the plurality of semiconductor chips 1020. The stack structure of the plurality of semiconductor chips 1020 and the control chip 1030 is sealed with an encapsulant 1040 such as a thermosetting resin, on the package substrate 1010.

In the present embodiment, a structure in which six semiconductor chips 1020 are vertically stacked on each other is illustrated as an example, but the number and stacking direction of the semiconductor chips 1020 are not limited thereto. In an example embodiment of the present inventive concept, the number of the semiconductor chips 1020 may be less or more than six. The plurality of semiconductor chips 1020 may be arranged in a horizontal direction on the package substrate 1010 or may be arranged in a connection structure in which vertical mounting and horizontal mounting are combined. In an example embodiment of the present inventive concept, the control chip 1030 may be omitted.

The package substrate 1010 may be formed of, for example, a flexible printed circuit board, a rigid printed circuit board, or a combination thereof. The package substrate 1010 includes an internal wiring 1012 and a connection terminal 1014. The connection terminal 1014 may be formed on one surface of the package substrate 1010. An external terminal 1016 is formed on the other surface of the package substrate 1010. The connection terminal 1014 is electrically connected to the external terminal 1016, for example, a solder ball 1016, through the internal wiring 1012 of the board. In an example embodiment of the present inventive concept, the external terminal 1016 may be implemented as a solder ball, a conductive bump, or a lead grid array (LGA).

The semiconductor chip 1020 may include the integrated circuit devices 100A and 100B according to the above-described embodiment of the present inventive concept, and may include a target-through region TTA in which an insulating material pattern IP having a first area and a dummy device pattern 135 having a second area smaller than the first area are alternately arranged in the region in which through-via structures 1022 and 1032 are formed.

The through-via structures 1022 and 1032 such as the TSV of each of the plurality of semiconductor chips 1020 and the control chip 1030 may be electrically connected to the connection terminal 1014 of the package substrate 1010 by a connection member 1050. The connection member 1050 may include a connection pad. For example, each of the plurality of semiconductor chips 1020 may include a system such as LSI, flash memory, DRAM, SRAM, EEPROM, PRAM, MRAM, or RRAM. In addition, the control chip 1030 may include logic circuits such as, for example, a serializer/deserializer (SER/DES) circuit.

As set forth above, according to an example embodiment, in the region in which the through-via structure is to be formed, for example, in the target-through region, by alternately arranging a dummy device pattern and an insulating material pattern (or a device isolation pattern), which have a relatively small area in a uniform distribution, to have a relatively low density, a contact failure due to residual material (e.g., residual gate electrode material which may be, for example, polysilicon) resulting from hole etching for the through-via structure may be prevented.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. An integrated circuit device comprising:

a substrate having an active surface and an inactive surface opposite to the active surface, wherein the substrate has a first region and a second region;

a device structure disposed on the active surface of the substrate, wherein the device structure has a plurality of individual devices disposed in the first region of the substrate and a target through-region disposed in the second region of the substrate;

a multilayer wiring structure including a plurality of wiring layers disposed at different levels in the multilayer wiring structure, wherein at least one wiring layer among the plurality of wiring layers has a landing pad overlapping the target through-region; and a through-via structure connected to the landing pad by penetrating through the second region of the substrate to pass through the target through-region, wherein the target through-region includes a plurality of first insulating material patterns and a plurality of dummy device patterns, wherein the plurality of first insulating material patterns are formed with a predetermined depth from the active surface and each have a first area, wherein the plurality of dummy device patterns are disposed on the active surface and each have a second area smaller than the first area, and wherein the plurality of first insulating material patterns are alternatively arranged with the plurality of dummy device patterns, in a direction parallel to the active surface of the substrate.

2. The integrated circuit device of claim 1, wherein each of the plurality of individual devices includes a gate electrode, and each of the plurality of dummy device patterns includes a dummy electrode pattern including the same material as a material of the gate electrode.

3. The integrated circuit device of claim 2, wherein the dummy electrode pattern includes polysilicon.

4. The integrated circuit device of claim 1, wherein the plurality of individual devices are disposed on an active region in the first region of the substrate, and the active region is defined by a device isolation pattern formed to a predetermined depth from the active surface, and each of the plurality of first insulating material patterns includes the same material as a material of the device isolation pattern.

5. The integrated circuit device of claim 1, wherein a sum of areas of the plurality of dummy device patterns is in a range of about 10% to about 40% of a total area of the target through-region.

6. The integrated circuit device of claim 1, wherein a sum of areas of the plurality of dummy device patterns is in a range of about 15% to about 30% of a total area of the target through-region.

7. The integrated circuit device of claim 1, wherein the target through-region includes a lattice structure in which the plurality of first insulating material patterns and the plurality of dummy device patterns are alternately arranged in first and second directions parallel to the active surface of the substrate and substantially perpendicular to each other.

8. The integrated circuit device of claim 7, wherein each of the plurality of first insulating material patterns has a square shape, and each of the plurality of dummy device patterns has a rectangular shape arranged along each side of the square shape of each of the plurality of first insulating material patterns.

9. The integrated circuit device of claim 8, wherein the target through-region includes a plurality of second insulating material patterns respectively disposed at adjacent corners of each of the plurality of first insulating material patterns and between adjacent dummy device patterns among the plurality of dummy device patterns.

10. The integrated circuit device of claim 1, wherein the second area ranges from about 10% to about 40% of the first area.

11. The integrated circuit device of claim 10, wherein the second area is less than or equal to about 40 $\mu m^2$.

12. The integrated circuit device of claim 1, wherein an area of the target through-region, penetrated by the through-via structure, is about 60% or less of a total area of the target through-region defined by an outer periphery of the target through-region.

13. The integrated circuit device of claim 1, further comprising a redistribution structure disposed on the inactive surface of the substrate and including a redistribution layer connected to the through-via structure.

14. An integrated circuit device comprising:

a substrate having an active surface and an inactive surface opposite to the active surface, wherein the substrate has a first region and a second region at least partially surrounding the first region;

a device structure disposed on the active surface of the substrate, wherein the device structure has a plurality of individual devices disposed in the first region of the substrate and a plurality of target through-regions arranged in the second region of the substrate;

a multilayer wiring structure including a plurality of wiring layers disposed at different levels in the multilayer wiring structure, wherein at least one wiring layer among the plurality of wiring layers has a plurality of landing pads, overlapping the plurality of target through-regions, respectively; and a plurality of through-via structures connected to the plurality of landing pads by penetrating through the second region of the substrate to pass through the plurality of target through-regions, respectively, wherein each of the plurality of target through-regions includes a lattice structure including a plurality of first insulating material patterns and a plurality of dummy device patterns, wherein the plurality of first insulating material patterns are formed with a predetermined depth from the active surface and each have a square shape with a first area, wherein the plurality of dummy device patterns are disposed on the active surface and each have a rectangular shape with a second area smaller than the first area, and wherein the plurality of first insulating material patterns are alternately arranged with the plurality of dummy device patterns in a row direction and a column direction.

15. The integrated circuit device of claim 14, wherein a length of each of the plurality of dummy device patterns is the same as a length of one side of each of the plurality of first insulating material patterns, and each of the plurality of target through-regions includes a plurality of second insulating material patterns respectively disposed at adjacent corners of each of the plurality of first insulating material patterns.

16. An integrated circuit device comprising:

a substrate having an active surface and an inactive surface opposite to the active surface, wherein the substrate has a first region and a second region at least partially surrounding the first region;

a device structure disposed on the active surface of the substrate, wherein the device structure includes a first device isolation pattern and a plurality of individual devices, wherein a first device isolation pattern is formed with a first depth from the active surface of the first region and defines an active region, and wherein the plurality of individual devices are disposed on the active region;

a plurality of target through-regions disposed along the active surface of the second region in the device structure, wherein the plurality of target through-regions include a plurality of second device isolation patterns and a plurality of dummy device patterns, wherein the plurality of second device isolation patterns are formed with a second depth from the active surface and each have a first area, and wherein the plurality of dummy device patterns are disposed on the active surface and each have a second area smaller than the first area, and wherein the plurality of second device isolation patterns are alternately arranged with the plurality of dummy device patterns, in a direction parallel to the active surface of the substrate;

a multilayer wiring structure disposed on the device structure and including a plurality of wiring layers at different levels, wherein at least one wiring layer of the plurality of wiring layers has a plurality of landing pads respectively overlapping each of the plurality of target through-regions;

a plurality of through-via structures respectively connected to the plurality of landing pads by penetrating through the second region of the substrate to pass through each of the plurality of target through-regions; and a redistribution structure disposed on the inactive surface of the substrate and including a redistribution layer connected to the plurality of through-via structures.

17. The integrated circuit device of claim 16, wherein the plurality of target through-regions have a lattice structure including the plurality of second device isolation patterns and the plurality of dummy device patterns alternately arranged in first and second directions parallel to the active surface of the substrate and substantially perpendicular to each other, and wherein a sum of areas of the plurality of dummy device patterns is in a range of about 15% to about 30% of a total area of each of the plurality of target through-regions.

18. The integrated circuit device of claim 16, wherein the plurality of individual devices include a gate electrode, and the plurality of dummy device patterns include the same material as a material of the gate electrode, and the plurality of second device isolation patterns include the same material as a material of the first device isolation pattern.

19. The integrated circuit device of claim 16, wherein a second depth of each of the plurality of second device isolation patterns is greater than a first depth of the first device isolation pattern.

20. The integrated circuit device of claim 16, wherein the substrate further includes a third region positioned between the first region and the second region, and wherein the integrated circuit device further comprises a plurality of connection pads connected to the plurality of wiring layers and located on the multilayer wiring structure of the third region.

* * * * *